US006815899B2

United States Patent
Choi

(10) Patent No.: US 6,815,899 B2
(45) Date of Patent: Nov. 9, 2004

(54) REMOTE PLASMA GENERATOR

(76) Inventor: Dae-Kyu Choi, #361-2, Shin-dong, Paldal-gu, Suwon-si, Kyounggi-do (KR)

(*) Notice: Subject to any disclaimer, the term of this patent is extended or adjusted under 35 U.S.C. 154(b) by 0 days.

(21) Appl. No.: 10/402,928

(22) Filed: Apr. 1, 2003

(65) Prior Publication Data
US 2004/0070346 A1 Apr. 15, 2004

(30) Foreign Application Priority Data
Oct. 10, 2002 (KR) .................................. 10-2002-0061884

(51) Int. Cl.$^7$ .................................................. H01J 7/24
(52) U.S. Cl. .............................. 315/111.21; 315/111.71
(58) Field of Search ........................ 315/111.21, 111.71, 315/111.31; 156/345, 643; 204/192 E, 298; 422/183.04; 333/32, 226; 219/121.4

(56) References Cited

U.S. PATENT DOCUMENTS

| 4,368,092 A | * | 1/1983 | Steinberg et al. ...... 156/345.48 |
| 4,844,612 A | * | 7/1989 | Durr et al. ................... 356/316 |
| 4,918,031 A | * | 4/1990 | Flamm et al. ............... 438/695 |
| 5,225,656 A | * | 7/1993 | Frind ..................... 219/121.47 |
| 5,270,515 A | * | 12/1993 | Long ........................... 219/687 |
| 5,304,282 A | * | 4/1994 | Flamm ......................... 216/68 |
| 5,420,044 A | * | 5/1995 | Kozuka ....................... 438/485 |
| 5,478,429 A | * | 12/1995 | Komino et al. ........ 156/345.44 |
| 5,770,982 A | * | 6/1998 | Moore .......................... 333/32 |
| 5,942,854 A | * | 8/1999 | Ryoji et al. ............. 315/111.21 |

* cited by examiner

Primary Examiner—Wilson Lee
Assistant Examiner—Chuc Tran
(74) Attorney, Agent, or Firm—Russell E. Bushnell, Esq.

(57) ABSTRACT

A remote plasma generator receives an A.C. source supplied from an A.C. power, ionizes process gas supplied from a gas source, generates plasma gas, and remotely supplies the generated gas to a process chamber. The remote plasma generator includes a main body with a gas inlet that is connected to the gas source and a gas outlet that is connected to the process chamber. A core cylinder is installed within the main body and cylindrical-shaped with an opening penetrating its center. A ring-shaped core is installed on the core cylinder. A connection pipe is included for connecting the outer surface of the main body to the inner surface of the core cylinder. An inductor coil is wound on the ring-shaped core and exposed to the outside of the main body via the connection pipe so as to be electrically connected to the A.C. power.

26 Claims, 10 Drawing Sheets

REMOTE PLASMA GENERATOR

CLAIM OF PRIORITY

This application makes reference to, incorporates the same herein, and claims all benefits accruing under 35 U.S.C. §119 from an application for REMOTE PLASMA GENERATOR earlier filed in the Korean Industrial Property Office on Oct. 10, 2002 and there duly assigned Serial No. 2002-61884.

BACKGROUND OF THE INVENTION

1. Field of the Invention

The present invention relates to a remote plasma generator, and more particularly to a remote plasma generator using an inductively coupled plasma technique.

2. Description of the Prior Art

Plasma sources are widely used in several processes during the manufacture of semiconductor devices, such as etching, stripping, cleaning of the devices., etc. In a process utilizing the plasma, density and uniformity of the plasma generation affect efficiency of the process. Consequently, several efforts have been made to increase the density and uniformity of the plasma generation.

A plasma process system employing a remote plasma generator remotely generates plasma and supplied the generated plasma to a process chamber, thereby preventing the yield deterioration due to particles generated by a plasma reaction. However, since process gas of a plasma condition is remotely supplied to the process chamber, the density of plasma generated by the remote plasma generator should be high.

Therefore, efforts have been made to increase the density of the plasma generated by the remote plasma generator. In order to increase the density of the plasma generation, a large portion of A.C. (alternating current) power supplied from the A.C. source should be converted to ionization energy. Thus, I provide a remote plasma generator with the high density of the plasma generation.

SUMMARY OF THE INVENTION

The present invention is disclosed in order to overcome the aforesaid and other drawbacks of the background art.

It is therefore, an object of the present invention to provide a remote plasma generator for improving the density of the plasma generation.

It is another object to provide a remote plasma generator for increasing the efficiency of energy transmission.

It is yet another object to provide a remote plasma generator for improving the density of the plasma generation that is easy and inexpensive to implement.

It is still another object to provide a remote plasma generator for improving the density of the plasma generation that is easy and inexpensive to manufacture.

In accordance with one aspect of the present invention, the above and other objects can be accomplished by the provision of a remote plasma generator which receives an A.C. source supplied from an A.C. power, ionizes process gas supplied from a gas source, generates plasma gas, and remotely supplies the generated gas to a process chamber, including: a main body including a gas inlet connected to the gas source and a gas outlet connected to the process chamber; a core cylinder installed within the main body and cylindrical-shaped with an opening penetrating its center; a ring-shaped core installed on the core cylinder; a connection pipe for connecting the outer surface of the main body to the inner surface of the core cylinder; and an inductor coil wound on the ring-shaped core and exposed to the outside of the main body via the connection pipe so as to be electrically connected to the A.C. power.

Preferably, the main body and the core cylinder may be made of a metal tube.

A ring-shaped insulator may be respectively attached to upper and lower surfaces of an inner plate of the core cylinder.

Further, preferably, the inner plate of the core cylinder insulated by the insulators may be connected to a part of the wound coil of the inductor coil.

The inductor coil may receive ignition power and A.C. power during an ignition section, and the inner plate of the core cylinder insulated by the insulators may serve as an ignition plug.

Moreover, preferably, the A.C. power and the ignition power may use one of a synchronous system and an asynchronous system.

The ring-shaped core may be at least one core stacked within the core cylinder.

The A.C. power may be a sine wave.

In accordance with another aspect of the present invention, there is provided a remote plasma generator which receives an A.C. source supplied from an A.C. power, ionizes process gas supplied from a gas source, generates plasma gas, and remotely supplies the generated gas to a process chamber, including: a main body including a gas inlet connected to the gas source and a gas outlet connected to the process chamber; a core cylinder installed within the main body and cylindrical-shaped with an opening penetrating its center; a ring-shaped core connected to the main body by parallel aligned two openings penetrating the main body; a vertical connector formed between two openings of the main body with upper and lower surfaces insulated from the main body by insulators; and an inductor coil wound on the ring-shaped core and having one end connected to the upper surface of the vertical connector and the other end connected to the lower surface of the vertical connector so as to use the vertical connector as a line extended from the core.

Preferably, the main body and the core cylinder may be made of a metal tube.

The inductor coil may receive ignition power and A.C. power during an ignition section, and the vertical connector insulated by the insulator may serve as an ignition plug.

Further, preferably, the A.C. power and the ignition power may use one of a synchronous system and an asynchronous system.

The ring-shaped core may be at least one core stacked within the core cylinder.

Moreover, the A.C. power may be a sine wave.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE PREFERRED EMBODIMENTS

Figure 1:
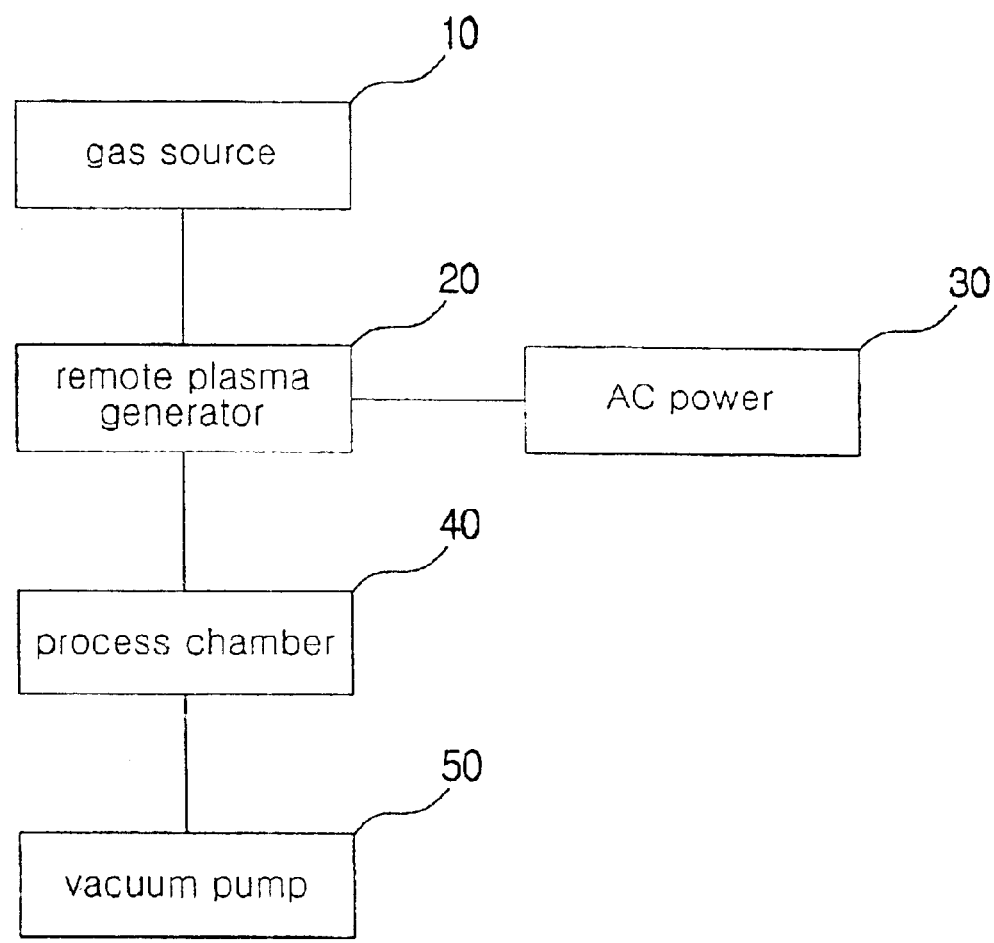
FIG. 1 is a block diagram of one example of a plasma process system employing a remote plasma generator of the present invention.

Now, preferred embodiments of the present invention will be described in detail with reference to the annexed drawings. In the drawings, the same or similar elements are denoted by the same reference numerals even though they are depicted in different drawings. In the following description, a detailed description of known functions and configurations incorporated herein will be omitted when it may make the subject matter of the present invention rather unclear.

FIG. 1 is a block diagram of one example of a plasma process system employing a remote plasma generator of the present invention.

With reference to FIG. 1, the plasma process system employing the remote plasma generator includes a gas source 10, a remote plasma generator 20, an A.C. power 30, a process chamber 40, and a vacuum pump 50.

The gas source 10 supplies process gas to the remote plasma generator 20. The remote plasma generator 20 receives an A.C. signal of a designated frequency supplied from the A.C. power 30 and ionizes the process gas, thereby generating plasma. For example, an A.C. source is supplied to the remote plasma generator 20.

The process gas of the plasma condition generated from the remote plasma generator 20 is supplied to the process chamber 40. The vacuum pump 50 uniformly maintains inner pressure of the process chamber 40 and discharges the process gas after the process. As described below, an impedance matching unit for impedance matching is interposed between the remote plasma generator 20 and the A.C. power 30.

As described above, in the plasma process system, the remote plasma generator 20 remotely generates plasma and supplies the generated plasma to the process chamber 40. Particularly, the remote plasma generator 20 of the present invention has a configuration so as to increase the density of the plasma generation, and its detailed description is described below.

Figure 2:
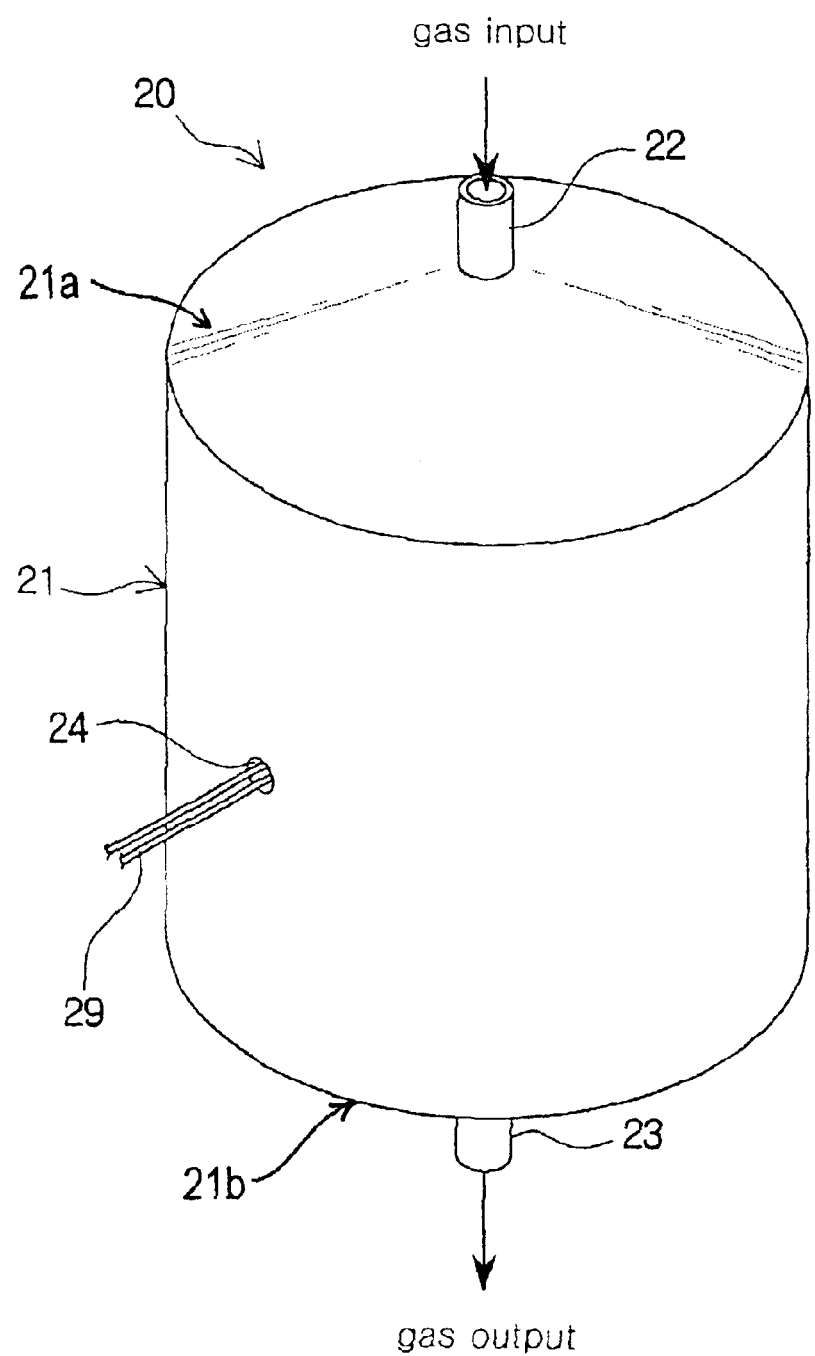
FIG. 2 is a perspective view of a remote plasma generator in accordance with a first embodiment of the present invention.

FIG. 2 is a perspective view of a remote plasma generator in accordance with a first embodiment of the present invention.

With reference to FIG. 2, the remote plasma generator 20 includes a cylindrical-shaped main body 21. The upper and lower surfaces of the main body 21 have protrusions on their central portions, respectively. A gas inlet 22 is formed on the protrusion of the upper surface 21a, and a gas outlet 23 is formed on the protrusion of the lower surface 21b.

Figure 3:
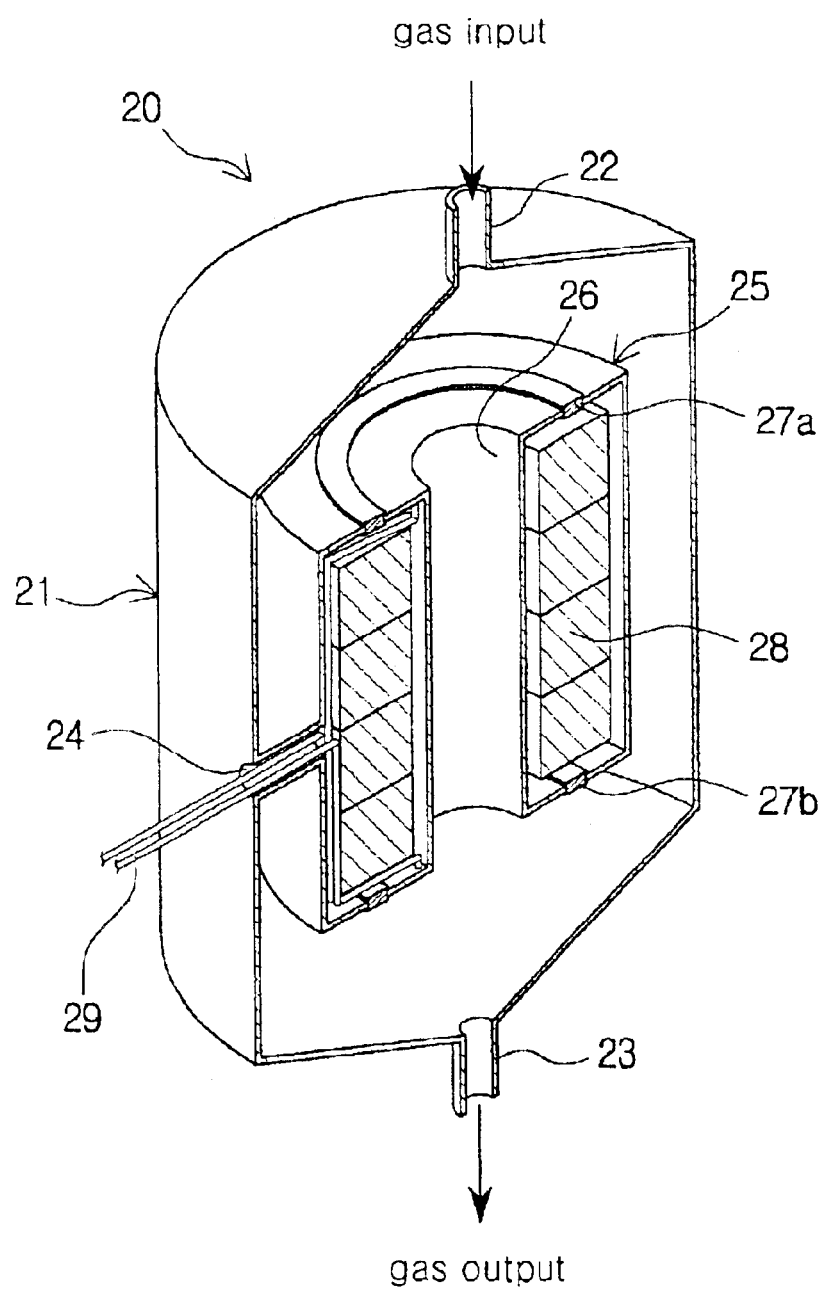
FIG. 3 is an exploded perspective view of the remote plasma generator of FIG. 2.
Figure 4:
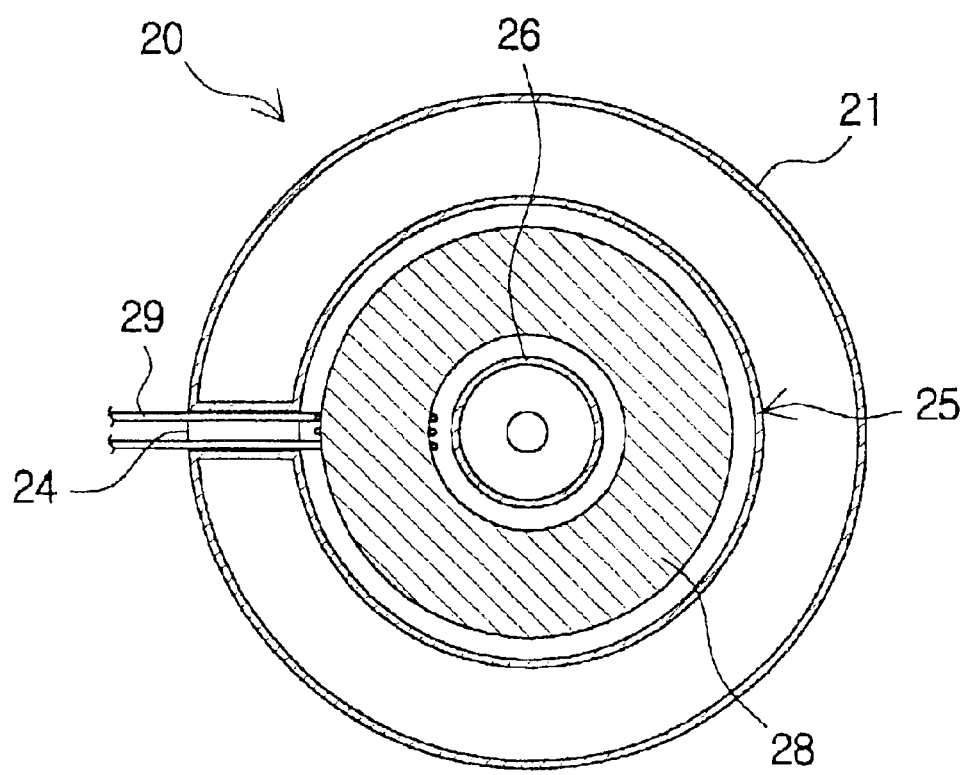
FIGS. 4 and 5 are cross-sectional and longitudinal-sectional views of the remote plasma generator of FIG. 2.
Figure 5:
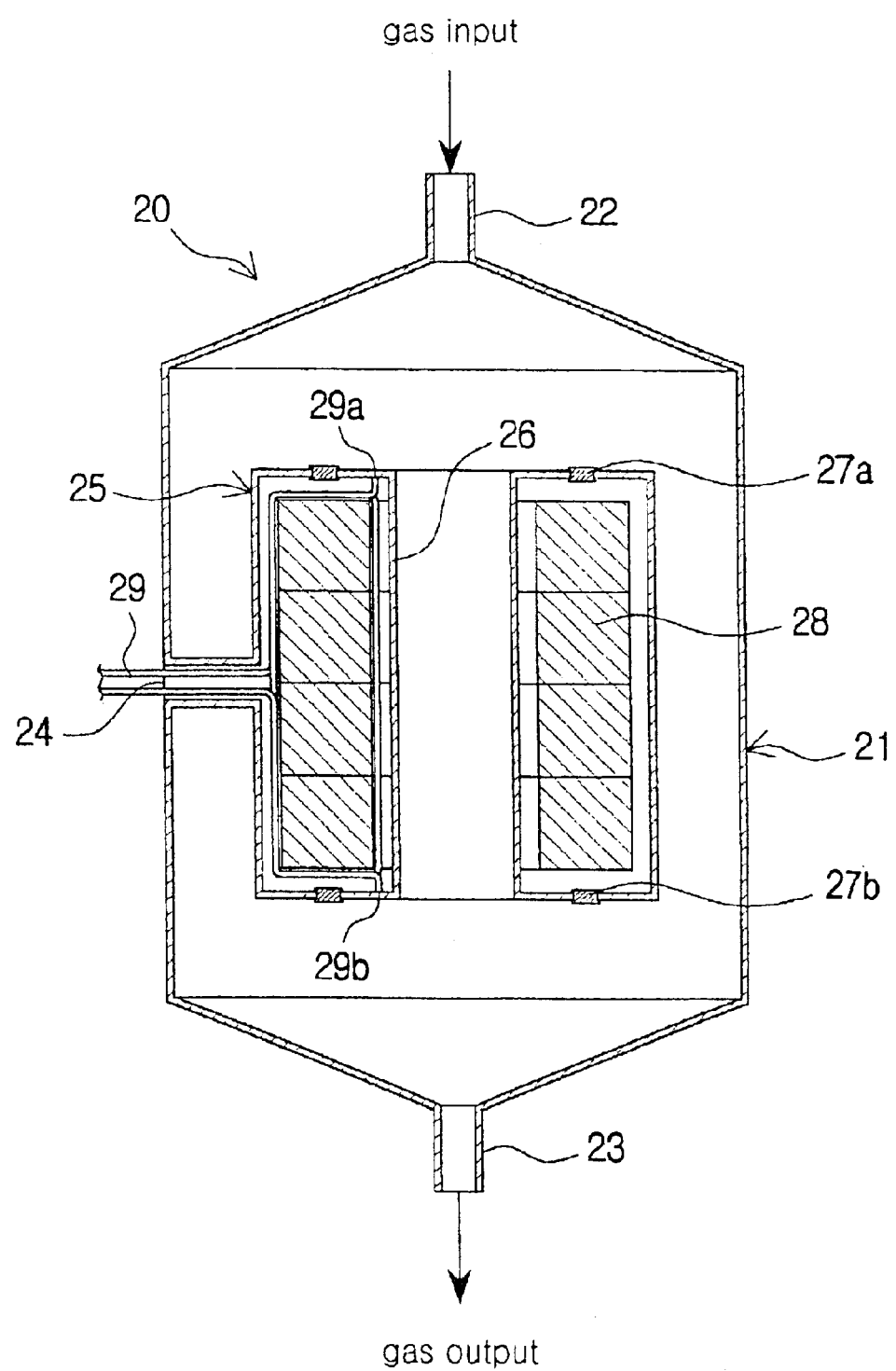

FIG. 3 is a perspectively exploded view of the remote plasma generator of FIG. 2, and FIGS. 4 and 5 are cross-sectional and longitudinal-sectional views of the remote plasma generator of FIG. 2.

With reference to FIGS. 3 to 5, the remote plasma generator 20 includes a core cylinder 25 for accommodating a plurality of ring-shaped cores 28 within the main body 21. The core cylinder 25 is fixed (or secured) to the inner center of the main body 21, for example, using a plurality of supporters (not shown).

An inductor coil 29 is wound several times on each core 28 within the core cylinder 25, and exposed to the outside via a connection pipe 24 so as to be electrically connected to the A.C. power 30 (through an impedance matching unit). The core cylinder 25 is cylindrical-shaped with the opening penetrating its center. At least one ring-shaped core 28 is stacked within the core cylinder 25.

The main body 21 and the core cylinder 25 are made of a metal tube. Ring-shaped insulators 27a and 27b are respectively attached to the upper and lower surfaces of the core cylinder 25. The inside and outside of the core cylinder 25 are vertically insulated from each other by the insulators 27a and 27b. Therefore, as described below, the current is prevented from flowing into the core cylinder 25 by an induced electric field.

An inner plate 26 of the core cylinder 25 is used as a line extended from the inductor coil 29. That is, as shown in FIG. 5, after the inductor coil 29 is wound several times on the core 28, one end 29a of the inductor coil 29 is connected to the upper surface of the inner plate 26. Then, the other end 29b of the coil 29 is connected to the lower surface of the inner plate 26 and exposed to the outside via the connection pipe 24. As described above, the inner plate 26 of the core cylinder 25 is used as the line extended from the coil 29, and as described below, the inner plate 26 serves as an ignition plug.

Hereinafter, an operation of the aforementioned remote plasma generator in accordance with the first embodiment of the present invention will be described.

Figure 6:
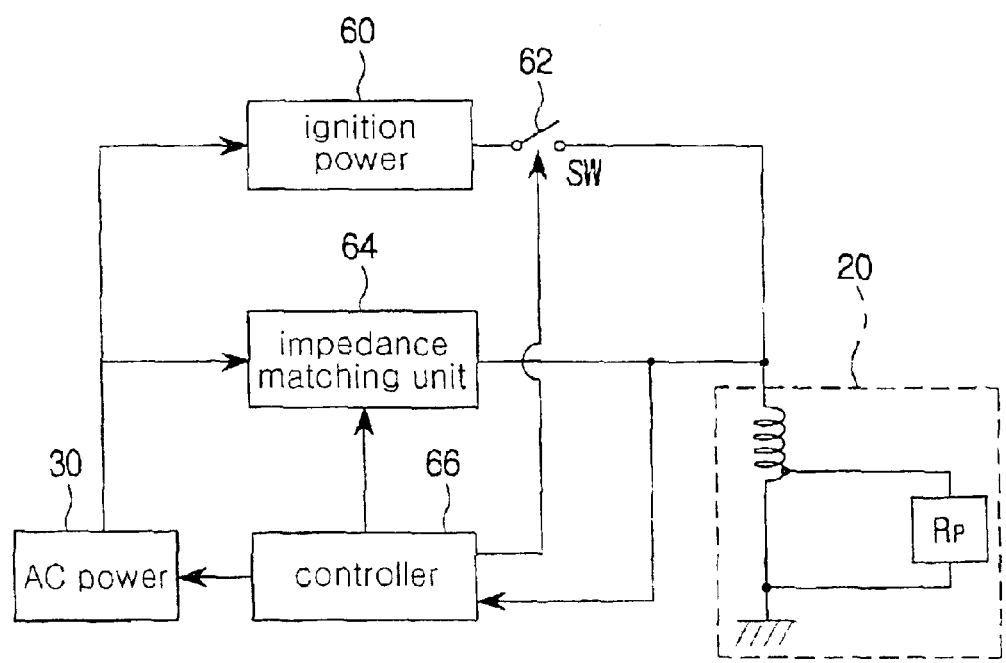
FIG. 6 is a block diagram showing a circuit configuration for operating the remote plasma generator of the present invention.

FIG. 6 is a block diagram showing a circuit configuration for operating the remote plasma generator of the present invention.

With reference to FIG. 6, the inductor coils 29 and the cores 28 of the remote plasma generator 20 are operated as an autotransformer, and receive an A.C. source supplied from the A.C. power 30 via the impedance matching unit 64. The impedance matching unit 64 includes a plurality of inductors, that is, variable or fixed inductors. An ignition power 60 receives the power supplied from the A.C. power 30 and then supplies ignition power for generating plasma to the inductor coil 29 of the remote plasma generator 20. A controller 66 carries out the control of a switch 62 for supplying the ignition power 60, the control of the impedance matching of the impedance matching unit 64, and the power supply of the A.C. power 30. That is, the controller 66 generally controls the system for generating plasma by an over-current control method. In the drawings, Rp denotes a plasma resistance.

Figure 7:
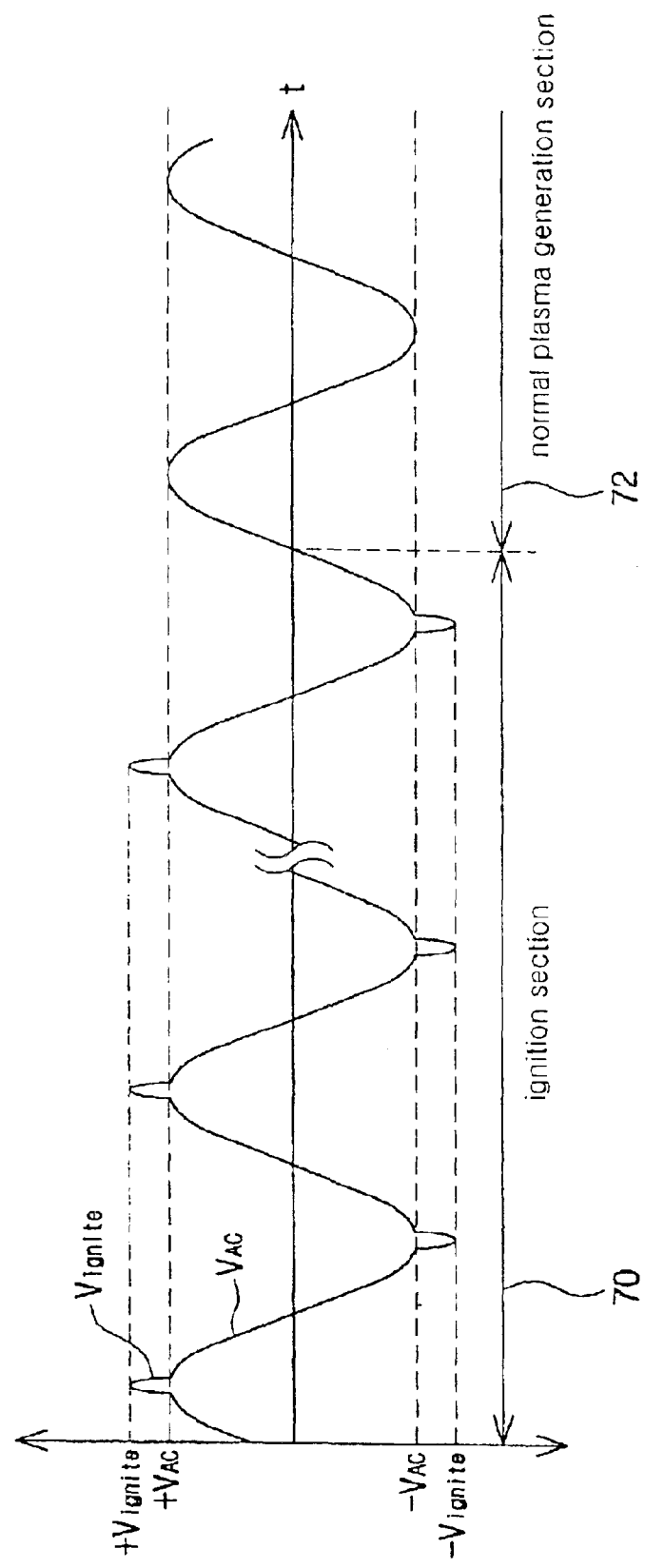
FIG. 7 illustrates an example of waveforms supplied from A.C. power and ignition power.

FIG. 7 illustrates an example of waveforms supplied from A.C. power and ignition power.

The process gas supplied from the gas source 10 flows into the main body 21 via the gas inlet 22 of the remote plasma generator 20. Herein, the A.C. power ($V_{AC}$) from the A.C. power 30 and the ignition power ($V_{ignite}$) from the ignition power 60 are coupled with each other, and then supplied to the inductor coil 29 during an ignition section. Herein, an induced magnetic field is generated by the inductor coil 29, and its magnetic flux is enhanced by the magnetic core 28. An induced electric field for forming a closed loop in a direction so as to interlink the ring-shaped cores 28 by the magnetic field induced by the inductor coil 29 is generated. Further, the inner plate 26 of the core cylinder 25 is used as the line extended from the coil 29 and serves as the ignition plug in supplying the ignition power ($V_{ignite}$).

During an ignition section 70, the process gas flown into the main body 21 is ionized by receiving energy, and plasma is generated. During a normal plasma generation section 72, the switch 62 is blocked to stop the supply of the ignition power ($V_{ignite}$), but allowed to supply the A.C. power ($V_{AC}$) from the A.C. power 30. The plasma gas is supplied to the process chamber 40 via the gas outlet 23. In this embodiment, the ignition power ($V_{ignite}$) and the A.C. power ($V_{AC}$) are supplied by a synchronous system. However, they may be supplied by an asynchronous system. The A.C. power ($V_{AC}$) supplied from the A.C. power 30 may use a sine wave.

This embodiment does not use a separate ignition plug, but uses the inner plate 26 of the core cylinder 25 as an ignition plug. However, a separate ignition plug may be used.

Next, with reference to FIGS. 8 to 10, a second embodiment of the present invention is described hereinafter.

Figure 8:
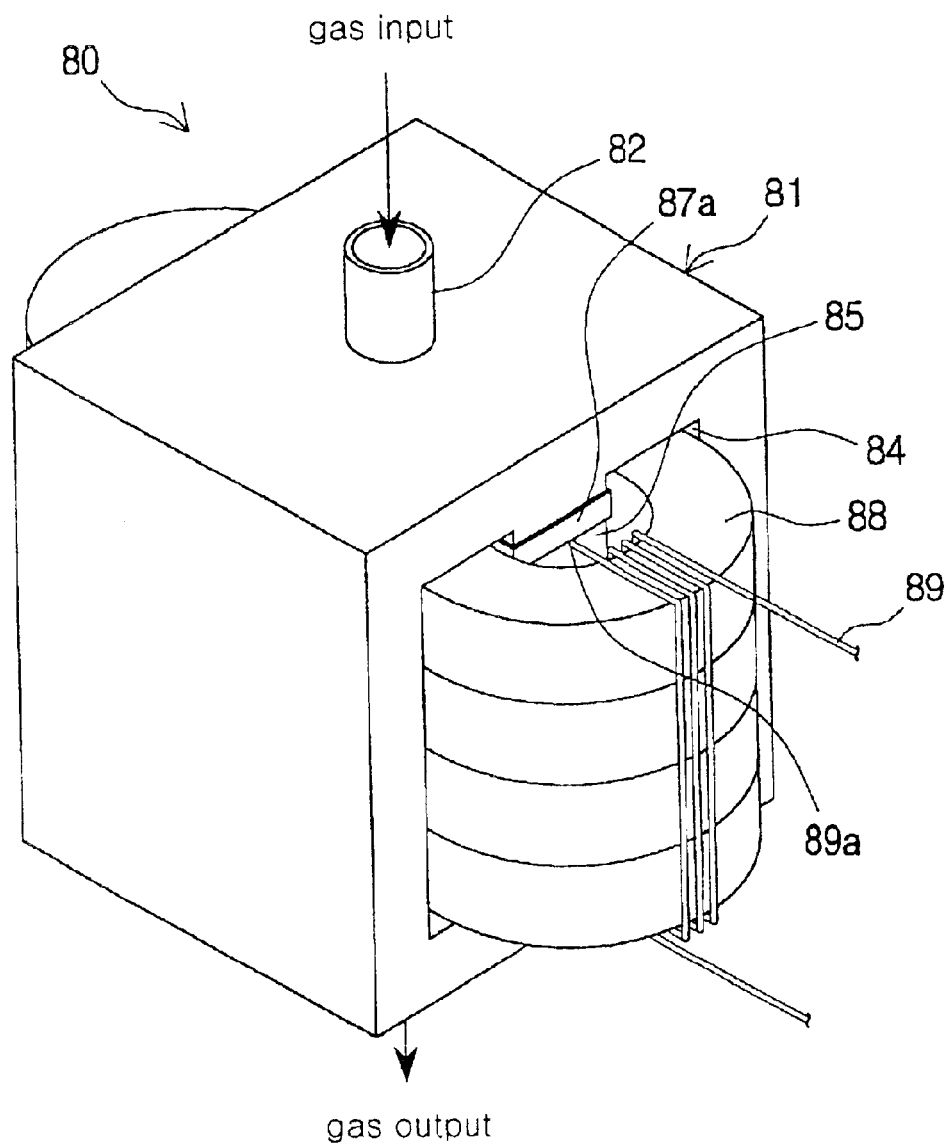
FIG. 8 is a perspective view of a remote plasma generator in accordance with a second embodiment of the present invention.

FIG. 8 is a perspective view of a remote plasma generator in accordance with a second embodiment of the present invention. FIG. 9 is a perspectively exploded view of the remote plasma generator of FIG. 8, and FIG. 10 is a partially exploded view of the remote plasma generator of FIG. 8.

Figure 9:
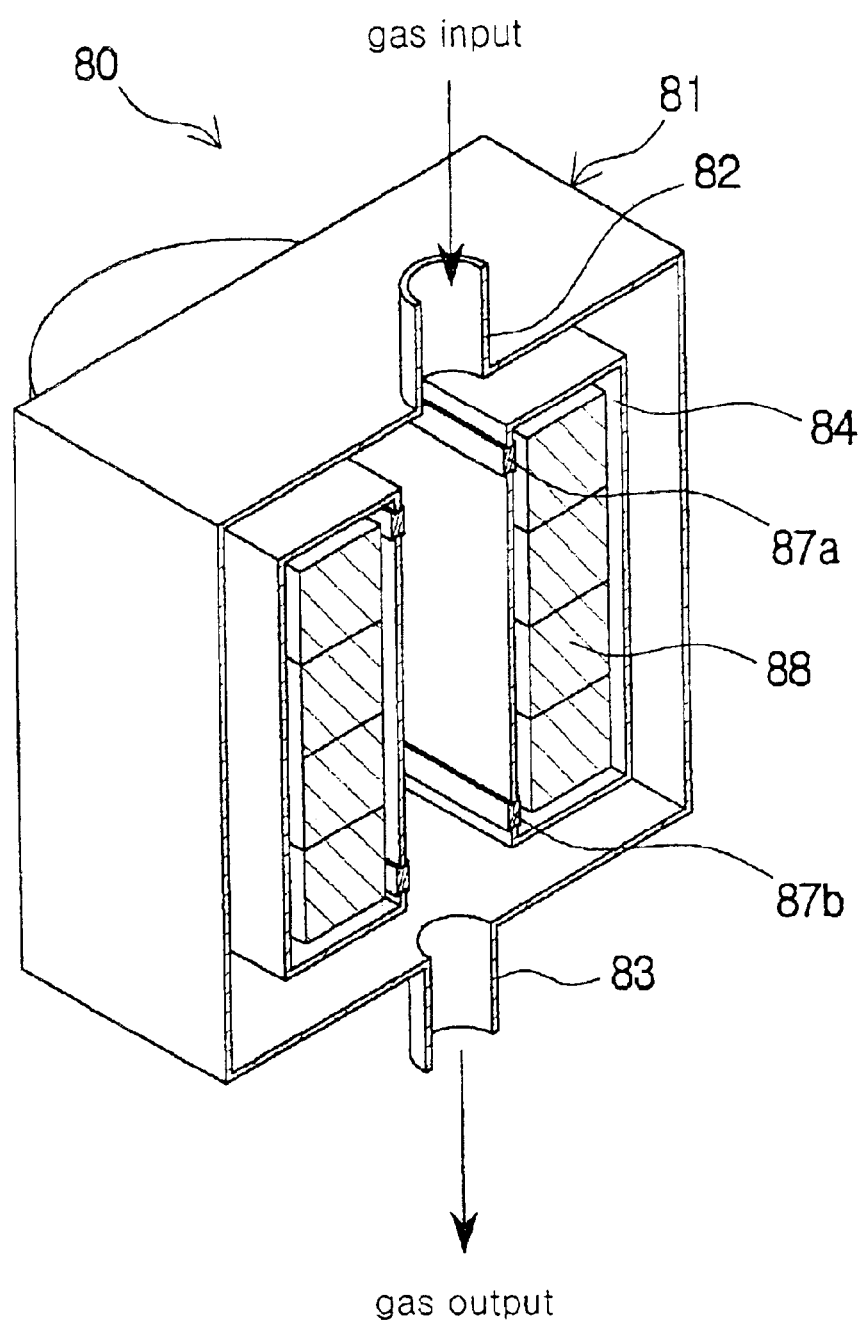
FIG. 9 is an exploded perspective view of the remote plasma generator of FIG. 8.
Figure 10:
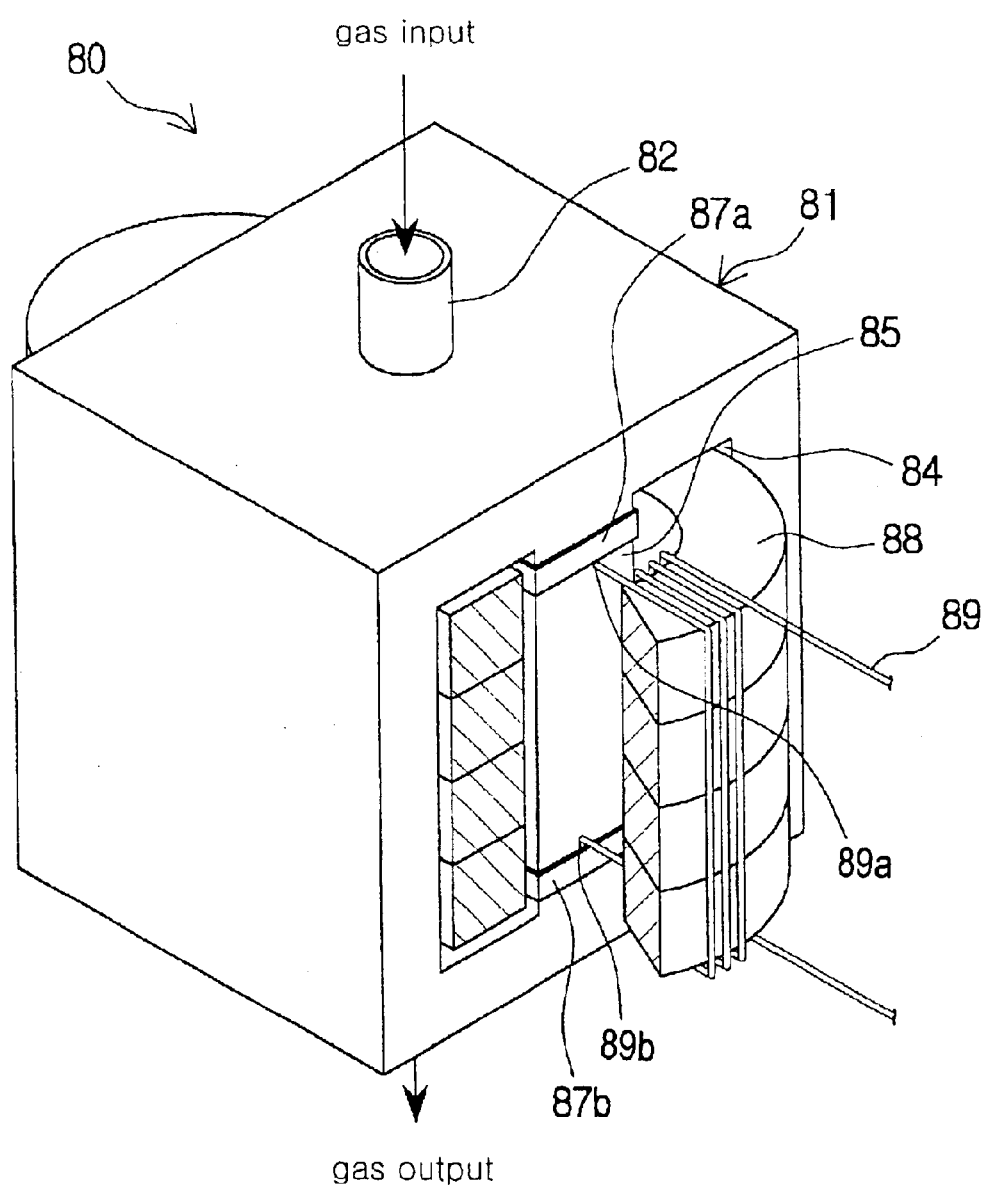
FIG. 10 is a partially exploded view of the remote plasma generator of FIG. 8.

With reference to FIGS. 8 to 10, a remote plasma generator 80 in accordance with the second embodiment of the present invention includes a main body 81 and at least a ring-shaped core 88 connected to the main body 81.

The main body 81 is cubical-shaped. Gas inlet and outlet 82 and 83 are respectively formed on the upper and lower surfaces of the main body 81. Two openings 84 are formed respectively with going through the front and rear surfaces of the main body 81 so that the core 88 can be inserted into the main body 81. Insulators 87a and 87b are respectively connected to upper and lower surfaces of a vertical connector 85 between the openings 84, thereby being insulated from the main body 81. After an inductor coil 89 is wound several times on the core 88, one end 89a of the inductor coil 89 is connected to the upper surface of the connector 85. The other end 89b of the inductor coil 89 is connected to the lower surface of the connector 85. The connector 85 is used as a line extended from the coil 29. As described in the first embodiment, the connector 85 serves as an ignition plug.

As described above, a circuit configuration for operating the remote plasma generator 80 in accordance with the second embodiment of the present invention is the same as the circuit configuration of FIG. 6. Therefore, its operation is omitted. The aforementioned remote plasma generator of the present invention uses a cooling system using a fluid. The process gas supplied by the gas source uses activated gas or inert gas, independently or jointly.

As apparent from the above description, the remote plasma generator of the present invention includes ring-shaped cores on its inner center, thereby increasing efficiency of energy transmission and improving the density of plasma generation.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A remote plasma generator receives an alternating current source supplied from an alternating current power, ionizes process gas supplied from a gas source, generates plasma gas, and remotely supplies the generated gas to a process chamber, said remote plasma generator comprising:
   a main body including a gas inlet connected to the gas source and a gas outlet connected to the process chamber;
   a core cylinder installed within said main body and cylindrical-shaped with an opening penetrating a center of said core cylinder;
   a ring-shaped core installed on said core cylinder;
   a connection pipe connecting an outer surface of said main body to an inner surface of said core cylinder; and
   an inductor coil wound on said ring-shaped core and exposed to the outside of said main body via said connection pipe accommodating an electrical connection to the alternating current power.

2. The remote plasma generator as set forth in claim 1, with said main body and said core cylinder being made of a metal tube.

3. The remote plasma generator as set forth in claim 2, further comprising a ring-shaped insulator being respectively attached to upper and lower surfaces of an inner plate of said core cylinder.

4. The remote plasma generator as set forth in claim 3, with said inner plate of said core cylinder insulated by the insulators, being connected to a part of the wound coil of said inductor coil.

5. The remote plasma generator as set forth in claim 4, with said inductor coil receiving ignition power and alternating current power during an ignition section, and said inner plate of said core cylinder insulated by the insulators serving as an ignition plug.

6. The remote plasma generator as set forth in claim 5, with the alternating current power and the ignition power using one of a synchronous system and an asynchronous system.

7. The remote plasma generator as set forth in claim 1, with the ring-shaped core being at least one ring-shaped core stacked within said core cylinder.

8. The remote plasma generator as set forth in claim 1, with the alternating current power being a sine wave.

9. A remote plasma generator receives an alternating current source supplied from an alternating current power, ionizes process gas supplied from a gas source, generates plasma gas, and remotely supplies the generated gas to a process chamber, said remote plasma generator comprising:
   a main body including a gas inlet connected to the gas source and a gas outlet connected to the process chamber;
   a ring-shaped core connected to said main body by two parallel-aligned openings penetrating said main body;
   a vertical connector formed between the two parallel-aligned openings of said main body with upper and lower surfaces insulated from said main body by insulators; and an inductor coil wound on said ring-shaped core and including one end connected to the upper surface of said vertical connector and the other end connected to the lower surface of said vertical connector accommodating to use said vertical connector as a line extended from said ring-shaped core.

10. The remote plasma generator as set forth in claim 9, with said main body being made of a metal tube.

11. The remote plasma generator as set forth in claim 10, with said inductor coil receiving ignition power and alternating current power during an ignition section, and said vertical connector insulated by the insulator serving as an ignition plug.

12. The remote plasma generator as set forth in claim 11, with the alternating current power and the ignition power using one of a synchronous system and an asynchronous system.

13. The remote plasma generator as set forth in claim 9, with said ring-shaped core being at least one core stacked.

14. The remote plasma generator as set forth in claim 9, with the alternating current power being a sine wave.

15. A remote plasma generator, comprising:
a main body including a gas inlet connected to a gas source and a gas outlet connected to a process chamber;
a ring-shaped core being installed within said main body;
a connection pipe connecting an outer surface of said main body to an inner surface of said main body; and
an inductor coil wound on said ring-shaped core and exposed to the outside of said main body via said connection pipe accommodating an electrical connection to an alternating current power.

16. The remote plasma generator of claim 15, further comprising a core cylinder installed within said main body with an opening penetrating a center of said core cylinder, said ring-shaped core being installed within said core cylinder.

17. The remote plasma generator of claim 16, further comprised of said core cylinder being installed on an inner center of said main body.

18. The remote plasma generator of claim 15, further comprising of:
said ring-shaped core connected to said main body through two parallel-aligned openings penetrating said main body; and
a vertical connector fonned between the two parallel-aligned openings of said main body with upper and lower surfaces insulated from said main body by insulators.

19. A method of making of a remote plasma generator, comprising:
forming a main body including a gas inlet connected to a gas source and a gas outlet connected to a process chamber;
installing a ring-shaped core within said main body;
forming a connection pipe connecting an outer surface of said main body to an inner surface of said main body; and
installing an inductor coil wound on said ring-shaped core and exposed to the outside of said main body via said connection pipe accommodating an electrical connection to an alternating current power.

20. The method of claim 19, further comprising of installing a core cylinder within an inner center of said main body with an opening penetrating a center of said core cylinder, said ring-shaped core being installed within said core cylinder.

21. The method of claim 19, further comprising of:
providing said ring-shaped core connected to said main body through two parallel-aligned openings penetrating said main body; and
providing a vertical connector formed between said two parallel-aligned openings of said main body with upper and lower surfaces insulated from said main body by insulators.

22. The remote plasma generator of claim 15, further comprising:
a core cylinder secured to an inner portion of said main body; and
an inner plate of said core cylinder including an upper surface connected to one end of said inductor coil, with said inner plate serving as an ignition plug.

23. The remote plasma generator of claim 15, further comprising of a controller unit controlling the generation of plasma by an over-current control method.

24. The remote plasma generator of claim 15, further comprising of an ignition plug.

25. A remote plasma generator, comprising:
a main body including a gas inlet connected to the gas source and a gas outlet connected to the process chamber;
a core connected to said main body by two parallel-aligned openings penetrating said main body;
a vertical connector formed between the two parallel-aligned openings of said main body with upper and lower surfaces insulated from said main body by insulators; and
an inductor coil wound on said core and including one end connected to the upper surface of said vertical connector and the other end connected to the lower surface of said vertical connector accommodating to use said vertical connector as a line extended from said core.

26. The remote plasma generator of claim 25, with said core being ring-shaped.

* * * * *

UNITED STATES PATENT AND TRADEMARK OFFICE
CERTIFICATE OF CORRECTION

PATENT NO.    : 6,815,899 B2
DATED         : November 9, 2004
INVENTOR(S)   : Dae-Kyu Choi It is certified that error appears in the above-identified patent and that said Letters Patent is hereby corrected as shown below:

Title page,
Item [74], *Attorney, Agent or Firm*, please correct from "Russell E. Bushnell, Esq." to -- Robert E. Bushnell, Esq. --

Signed and Sealed this

First Day of February, 2005

JON W. DUDAS
*Director of the United States Patent and Trademark Office*